(12) United States Patent
Mitobe (10) Patent No.: US 6,580,199 B2
(45) Date of Patent: Jun. 17, 2003

(54) SURFACE ACOUSTIC WAVE APPARATUS (75) Inventor: Seiichi Mitobe, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/881,718

(22) Filed: Jun. 18, 2001

(65) Prior Publication Data

US 2001/0040421 A1 Nov. 15, 2001

Related U.S. Application Data (63) Continuation of application No. PCT/JP00/06703, filed on Sep. 28, 2000.

(30) Foreign Application Priority Data

Oct. 18, 1999 (JP) .............................................. 11-294748

(51) Int. Cl.$^7$ .............................................. H01L 41/08
(52) U.S. Cl. ................................... 310/313 B; 333/193
(58) Field of Search .......................... 310/313 B, 313 R, 310/313 C, 313 D; 333/150–155, 193–196

(56) References Cited

U.S. PATENT DOCUMENTS

| | | | | |
|---|---|---|---|---|
| 4,162,465 A | | 7/1979 | Hunsinger et al. | |
| 5,663,695 A | * | 9/1997 | Tanaka et al. | 310/313 B |
| 6,075,426 A | * | 6/2000 | Tsutsumi et al. | 333/193 |
| 6,127,904 A | * | 10/2000 | Tanaka et al. | 333/193 |
| 6,246,150 B1 | * | 6/2001 | Mitobe | 310/313 B |
| 6,297,713 B1 | * | 10/2001 | Kadota et al. | 333/133 |

FOREIGN PATENT DOCUMENTS

WO    WO 01/31782 A1    5/2001

* cited by examiner

Primary Examiner—Mark O. Budd
(74) Attorney, Agent, or Firm—Oblon, Spivak, McClelland, Maier & Neustadt, P.C.

(57) ABSTRACT

There is provided an apparatus that shows a much better transmission function characteristic in a signal passing band, and a low insertion loss. A plurality of pairs of electrode fingers constitute a first split electrode group of $5a1$, $5b1$, $5a2$, $5b2$, $5a3$, $5b3$, . . . . Further, a plurality of pairs of electrode fingers constitute a second split electrode group of $6a1$, $6b1$, $6a2$, $6b2$, $6a3$, $6b3$, . . . . The pairs of electrode fingers of both the groups are interleaved. The pairs of electrode fingers include electrode fingers of a width narrower than $\lambda/8$ ($\lambda$ indicates the wavelength of a surface acoustic wave serving as the operation central frequency), and electrode fingers of a width wider than $\lambda/8$, and the distance between the centers of the adjacent electrode fingers differs from $\lambda/4$.

10 Claims, 6 Drawing Sheets

SURFACE ACOUSTIC WAVE APPARATUS

CROSS-REFERENCE TO RELATED APPLICATIONS

This is a Continuation Application of PCT Application No. PCT/JP00/06703, filed Sep. 28, 2000, which was not published under PCT Article 21(2) in English.

This application is based upon and claims the benefit of priority from the prior Japanese Patent Application No. 11-294748, filed Oct. 18, 1999, the entire contents of which are incorporated herein by reference.

BACKGROUND OF THE INVENTION

The present invention relates to a surface acoustic wave apparatus having an interdigital transducer formed on a piezoelectric substrate.

A surface acoustic wave apparatus is mainly used as an intermediate frequency filter for electronic devices. These devices include television sets, communication devices, and cellular phones (of, for example, the CDMA system), etc. The surface acoustic wave apparatus is characterized in that it is compact and lightweight, and thus can be utilized to the full when utilized in a cellular phone.

Low loss, a narrow bandwidth and a steep cut-off frequency are demanded by the intermediate frequency filter for use in a cellular phone. As a filter serving as an intermediate frequency filter of this type, a surface acoustic wave apparatus having an interdigital transducer (IDT) as a main structural element has been developed.

In this surface acoustic wave apparatus, to meet the demands of narrow bandwidth and steep cut-off frequency characteristics, a piezoelectric substrate is used which is formed of a material, such as crystal, having characteristics of low fluctuation in oscillation irrespective of temperature changes.

In the surface acoustic wave apparatus, it is known that an internal reflected wave (a reflected acoustic wave, a reflected electric wave) occurs since the apparatus utilizes a mechanical vibration such as a surface acoustic wave (SAW). The internal reflected wave adversely influences the fundamental wave of the surface acoustic wave, thereby causing its amplitude attenuation or phase distortion, etc. To reduce the influence of the reflected wave upon the fundamental wave and to adjust the direction of transmission of the fundamental wave to a predetermined direction, a technique for adjusting or trimming the width of an electrode finger in the IDT section of the surface acoustic wave apparatus has been developed. This technique is disclosed in, for example, Jpn. Pat. Appln. KOKAI Publication No. 54-17647.

In the disclosed apparatus, the adverse influence of the internal reflected wave upon the fundamental wave is not completely removed. In view of the transmission function characteristic of a signal passing band in the surface acoustic wave apparatus, the adverse influence appears as a characteristic curve asymmetric with respect to the basic frequency at the center of the curve, or as a distorted characteristic curve.

A description will now be given of the phase relationship between the exited wave and the reflected wave in the surface acoustic wave apparatus, which the inventors of this invention have especially focused on.

Figure 1A:
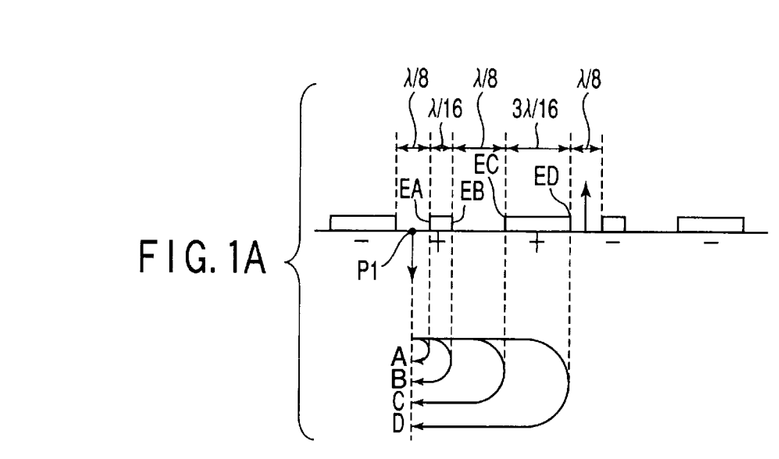
FIGS. 1A to 1D are views useful in explaining the operations and characteristics of a surface acoustic wave apparatus, to which the inventors of the present invention have paid attention.
Figure 1B:
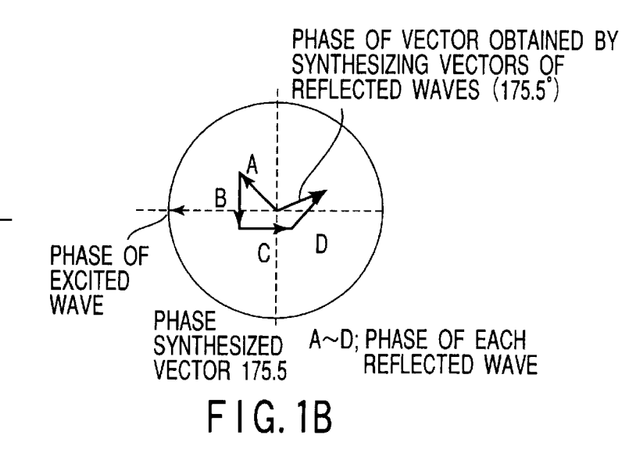
Figure 1C:
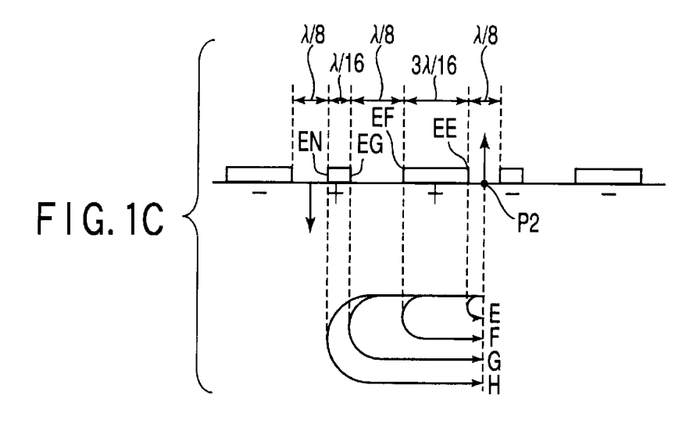

FIGS. 1A and FIG. 1C show cross sections of essential parts of the surface acoustic wave apparatus. The electrode fingers of the surface acoustic wave apparatus include pairs of electrode fingers of a narrow width of $\lambda/16$, and pairs of electrode fingers of a wide width of $3\lambda/16$. Further, a plurality of pairs of electrode fingers projecting from a first common electrode and a plurality of pairs of electrode fingers projecting from a second common electrode are alternately arranged. The interval between each pair of adjacent electrode fingers is set at $\lambda/8$.

Figure 1D:
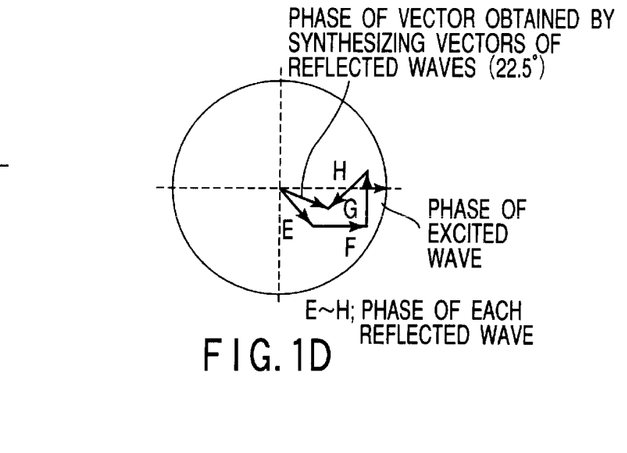

FIG. 1B shows the phase relationship between the excited wave and the internal reflected wave that advances to the left in the figure, while FIG. 1D shows the phase relationship between the excited wave and the internal reflected wave that advances to the right in the figure. Suppose that the phase of the excited wave is a reference value, and the clockwise direction with respect to the phase of the vector of the excited wave is the direction of a phase delay in the reflected wave.

Referring first to FIGS. 1A and 1B, the relationship between the reflected wave that advances to the left in the figures, and the excited wave will be described.

Suppose that P1 represents any randomly-selected excitation point at which the surface acoustic wave is excited, A represents a reflected wave reflected from one EA of the edges of an electrode finger of a width ($\lambda/16$) closest to the excitation point, and B represents a reflected wave reflected from the other edge EB of the electrode finger. Further, suppose that C represents a wave from the excitation point as a reference point, which is passed through the electrode finger closest to the excitation point, and reflected from one EC of the edges of an electrode finger of a width of $3\lambda/16$ adjacent to the first-mentioned electrode finger, and D represents a reflected wave reflected from the other edge ED of the second-mentioned electrode finger.

Concerning the reflected wave A, a phase delay element equal to a distance of $0.125\lambda$ with respect to the phase of the excited wave at the excitation point occurs, and hence a phase delay of 45° occurs with respect to the phase of the excited wave. In other words, supposing that a delay $=X$, $X=45°$ is given by the following equation:

$$((0.125/2) \times 2)\lambda : X = \lambda : 360°$$

($\times 2$) included in this equation indicates a coefficient for obtaining a double distance.

Further, concerning the reflected wave B, a phase delay element equal to a distance of $(0.125+(\frac{1}{8}))\lambda$ with respect to the phase of the excited wave at the excitation point P1 occurs, and phase inversion $((\frac{1}{2})\lambda)$ occurs at the edge EB. Accordingly, a phase delay of 270° occurs with respect to the phase of the excited wave. In other words, supposing that a delay$=X$, $X=360 \times (0.125+(\frac{1}{8})+(\frac{1}{2}))=270°$ is given by $$\{((0.125/2) \times 2)+((\frac{1}{16}) \times 2)+(\frac{1}{2})\}\lambda : X = \lambda : 360$$

($\times 2$) included in this equation indicates a coefficient for obtaining a double distance, and ($\frac{1}{2}$) indicates the amount of phase inversion at the edge EB.

Concerning the reflected wave C, a phase delay element equal to a distance of $(0.125+(\frac{1}{8})+(\frac{1}{4}))\lambda$ with respect to the phase of the excited wave at the excitation point P1 occurs, and hence a phase delay of 180° occurs with respect to the phase of the excited wave. In other words, supposing that a delay$=X$, $X=360 \times (0.125+(\frac{1}{8})+(\frac{1}{4}))=180°$ is given by $$\{((0.125/2) \times 2)+((\frac{1}{16}) \times 2)+((\frac{1}{8}) \times 2)\}\lambda : X = \lambda : 360$$

($\times 2$) included in this equation indicates a coefficient for obtaining a double distance.

Concerning the reflected wave D, a phase delay element equal to a distance of $(0.125+(\frac{1}{8})+(\frac{1}{4})+(\frac{3}{8}))\lambda$ with respect to the phase of the excited wave at the excitation point P1 occurs, and phase inversion occurs at the edge ED. Accordingly, a phase delay of 135° occurs with respect to the phase of the excited wave. In other words, supposing that a delay=X, X=360×((1/8)+(1/8)+(1/4)+(3/8)+(1/2))=495°=135° is given by $$\{((^{0.125}/_2)\times 2)+((^{1}/_{16})\times 2)+((^{1}/_8)\times 2)+(^{3}/_{16})\times 2+(^{1}/_2)\}\lambda : X=\lambda : 360$$

(×2) included in this equation indicates a coefficient for obtaining a double distance, and (½) indicates the amount of phase inversion at the edge ED.

The result of synthesizing the vectors of the reflected waves A, B, C and D corresponds to the phase delay amount of the internal reflected wave relative to the excited wave. As shown in FIG. 1B, the phase of the vector obtained by synthesizing the vectors of the internal reflected waves A, B, C and D is 157.5°. This value indicates that the phase is deviated by 22.5° from a phase (180°) in a direction in which the excited wave is offset.

The synthesized vector is obtained by synthesizing the x- and y-components of the vectors of the reflected waves A, B, C and D in the orthogonal coordinates.

Referring then to FIGS. 1C and 1D, the relationship between the reflected wave that advances to the right in the figures and the excited wave will be explained.

Suppose that P2 represents any randomly-selected excitation point at which the surface acoustic wave is excited, E represents a reflected wave reflected from one EE of the edges of an electrode finger of a width (3λ/16) closest to the excitation point, and F represents a reflected wave reflected from the other edge EF of the electrode finger. Further, suppose that G represents a wave from the excitation point as a reference point, which is passed through the electrode finger closest to the excitation point, and reflected from one EG of the edges of an electrode finger of a width of λ/16 adjacent to the first-mentioned electrode finger, and H represents a reflected wave reflected from the other edge EH of the second-mentioned electrode finger.

Concerning the reflected wave E, a phase delay element equal to a distance of 0.125λ with respect to the phase of the excited wave at the excitation point P2 occurs, and hence a phase delay of 45° occurs with respect to the phase of the excited wave.

Further, concerning the reflected wave F, a phase delay element equal to a distance of (0.125+(3/8)) λ with respect to the phase of the excited wave at the excitation point P2 occurs, and phase inversion occurs at the edge EF. Accordingly, a phase delay of 0° occurs with respect to the phase of the excited wave.

Concerning the reflected wave G, a phase delay element equal to a distance of (0.125+(3/8)+0.25) λ with respect to the phase of the excited wave at the excitation point P2 occurs, and hence a phase delay of 270° occurs with respect to the phase of the excited wave.

Concerning the reflected wave H, a phase delay element equal to a distance of (0.125+(3/8)+0.25+(1/8)) λ with respect to the phase of the excited wave at the excitation point P2 occurs, and phase inversion occurs at the edge EH. Accordingly, a phase delay of 190° occurs with respect to the phase of the excited wave.

The above-described phase delays can be given by the same equations as used when explaining FIGS. 1A and 1B.

The result of synthesizing the vectors of the reflected waves E, F, G and H corresponds to the phase delay amount of the internal reflected wave relative to the excited wave. As shown in FIG. 1D, the phase of the vector obtained by synthesizing the vectors of the internal reflected waves E, F, G and H is 22.5°. This value indicates that the phase is deviated by 22.5° from a phase (0°) in the same direction as that of the excited wave.

It is understood from the above-described results that the excited wave (fundamental wave) is not transmitted in a desired direction with a sufficiently high coefficient because of the influence of the reflected wave.

It is the object of the invention to provide a surface acoustic wave apparatus that shows a much better transmission function characteristic in its signal passing band, and a low insertion loss.

BRIEF SUMMARY OF THE INVENTION

To attain the object, the following apparatus is provided:

(A) A surface acoustic wave apparatus equipped with an interdigital transducer that includes first and second common electrodes formed in parallel on a piezoelectric substrate, a first split electrode group connected to the first common electrode and extending toward the second common electrode, and a second split electrode group connected to the second common electrode and extending toward the first common electrode; characterized in that:

a plurality of pairs of electrode fingers that constitute the first split electrode group, and a plurality of pairs of electrode fingers that constitute the second split electrode group are interleaved at a cycle of λ/2;

each pair of electrode fingers consist of a narrow-width electrode finger narrower than λ/8 (λ indicates a wavelength of a surface acoustic wave serving as an operation central frequency), and a wide-width electrode finger wider than λ/8; and a synthesized vector, obtained by synthesizing vectors of waves reflected from electrode fingers that are included within a distance of λ/2 from any randomly-selected excitation point in a surface wave propagation direction, has a phase φ expressed by nπ−5°≦φ≦nπ+5° (n: a natural number) with respect to a phase of a wave excited by the interdigital transducer.

(B) The surface acoustic wave apparatus of the present invention described in item (A) has a structure in which a distance (t1) between centers of a randomly-selected electrode finger and one of the electrode fingers located at the opposite sides of the randomly-selected electrode finger, differs from a distance (t2) between centers of the randomly-selected electrode finger and the other of the electrode fingers located at the opposite sides of the randomly-selected electrode finger.

(C) The surface acoustic wave apparatus of the present invention described in item (A) is characterized in that said each pair of electrode fingers consist of a narrow-width electrode finger having a width of λ/16, and a wide-width electrode finger having a width w of 0.1465λ≦w≦0.1605λ.

(D) A surface acoustic wave apparatus according to another aspect of the present invention is characterized in that: a plurality of pairs of electrode fingers that constitute the first split electrode group, and a plurality of pairs of electrode fingers that constitute the second split electrode group are interleaved; each pair of electrode fingers consist of a narrow-width electrode finger narrower than λ/8 (λ indicates a wavelength of a surface acoustic wave serving as an operation central frequency), and a wide-width electrode finger wider than λ/8; a sum of the widths of the narrow-width electrode finger and the wide-width electrode finger is lower than λ/4; and a sum of the widths of the narrow-width electrode finger and the wide-width electrode finger and a distance between adjacent edges of these electrode fingers is 3λ/8.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be described with reference to the accompanying drawings.

Figure 2:
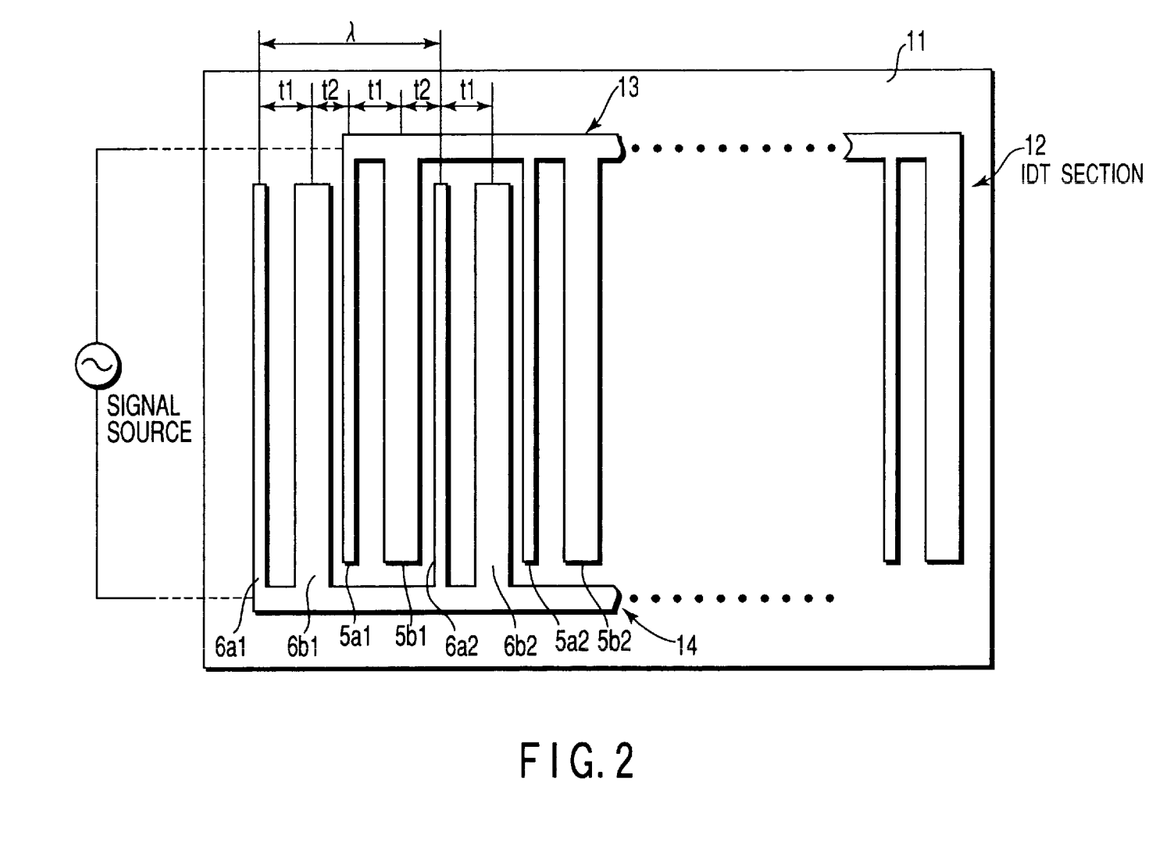
FIG. 2 is a view illustrating a surface acoustic wave apparatus according to an embodiment of the present invention.

In FIG. 2, reference numeral 1 denotes a piezoelectric substrate made of crystal, on one surface of which an interdigital transducer section 12 is formed.

In the interdigital transducer section 12, a first common electrode 13 and a second common electrode 14 are arranged parallel to each other with a space interposed therebetween. The first common electrode 13 is connected to a first split electrode group (electrode fingers 5a1, 5b1, 5a2, 5b2, 5a3, 5b3, . . . ) extending toward the second common electrode 14. Further, the second common electrode 14 is connected to a second split electrode group (electrode fingers 6a1, 6b1, 6a2, 6b2, 6a3, 6b3, . . . ) extending toward the first common electrode 13.

In the first split electrode group, pairs of narrow-width electrode fingers (with suffix a) and wide-width electrode fingers (with suffix b) are arranged repeatedly with a certain interval between adjacent pairs. Also in the second split electrode group, pairs of narrow-width electrode fingers (with suffix a) and wide-width electrode fingers (with suffix b) are arranged repeatedly with a certain interval between adjacent pairs.

The pairs of electrode fingers (5a1, 5b1), (5a2, 5b2), (5a3, 5b3), . . . included in the first split electrode group and the pairs of electrode fingers (6a1, 6b1), (6a2, 6b2), (6a3, 6b3), . . . included in the second split electrode group are interleaved. When viewing the entire structure, the narrow-width electrode fingers and the wide-width electrode fingers are alternately arranged.

The common electrodes 13 and 14 and the split electrode groups are formed of electrode films containing aluminum (Al) or an aluminum (Al) alloy as a main component.

Further, in this embodiment, each pair of electrode fingers consist of an electrode finger 5b1, 5b2, 5b3, . . . , 6a1, 6a2, 6a3, . . . , which has a width narrower than $\lambda/8$ ($\lambda$ indicates the wavelength of a surface acoustic wave serving as the operation central frequency), and an electrode finger 5a1, 5a2, 5a3, . . . , 6b1, 6b2, 6b3, . . . , which has a width wider than or equal to $\lambda/8$. More specifically, in this embodiment, the narrow-width electrode fingers have a width of $\lambda/16$, while the wide-width electrode fingers have a width of $3\lambda/16$.

Distances t1, t2, t1, t2, . . . each between the centers of each pair of adjacent electrode fingers differ from $\lambda/4$ (which is a reference value in this embodiment). The distance t1 between the centers is a positive deviation from the reference value (i.e. higher than the reference value), while the distance t2 between the centers is a negative deviation from the reference value (i.e. lower than the reference value). The distances t1 and t2 are alternately arranged.

Specifically, the centers of adjacent electrode fingers are arranged with alternate distances interposed therebetween, which have positive and negative deviations from the reference value of $\lambda/4$. These deviations adjust the phase delays of the reflected wave in the IDT with respect to the excited wave. As will be described later, this adjustment enables the direction of advance of the internal reflected wave to be changed to a direction optimal for the advance direction of the fundamental wave of the surface acoustic wave.

In this embodiment, the following equations are established:

$$t1=((0.152+(1/8))\lambda$$

$$t2=((0.098+(1/8))\lambda$$

$$t1+t2=\lambda/2$$

where $0.152\lambda$ and $0.098\lambda$ represent distances between the opposed edges of the electrode fingers, while $\lambda/8$ represents the sum of half the width of each electrode finger included in each pair. Accordingly, the distance between the centers of the electrode fingers located at the opposite sides of any randomly-selected electrode finger is $\lambda/2$.

As a result of the research made by the inventors, the distances t1 and t2 between the centers of the electrode fingers were found to be values that enable the fundamental wave of the surface acoustic wave to be guided in an optimal direction. The method of determining the values of t1 and t2 can be expressed by the following general equations.

Supposing that the width of one of each pair of electrode fingers is $w$, the width of the other electrode finger is $((\lambda/4)-w)$, and the distance between the centers of these two electrode fingers is x1, x1 is set at a value that substantially satisfies the following equation:

$$\tan\{k(x1-(\lambda/8))\}=1/\cos\{k((3\lambda/4)+2w)\}$$

(k represents the number of waves; $k=2\pi/\lambda$.)

When x1 satisfies the equation, the fundamental wave of the surface acoustic wave can have an optimal directional property.

Where one electrode finger has a width of $\lambda/16$, and the other electrode finger has a width of $3\lambda/16$, it is sufficient if the distance x2 between the centers of these electrode fingers is set at a value that substantially satisfies the following equation:

$$\tan\{k(x2-\lambda/8)\}=\sqrt{2}$$

Referring now to FIGS. 3A to 3D, a description will be given of the phase relationship between the internal reflected waves and the excited wave (fundamental wave) in the surface acoustic wave apparatus of this embodiment.

Figure 3A:
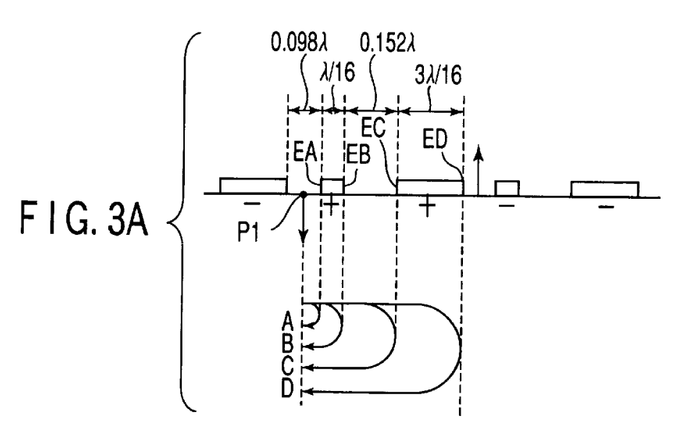
FIGS. 3A to 3D are views useful in explaining the principle of the operation of the surface acoustic wave apparatus shown in FIG. 2.
Figure 3B:
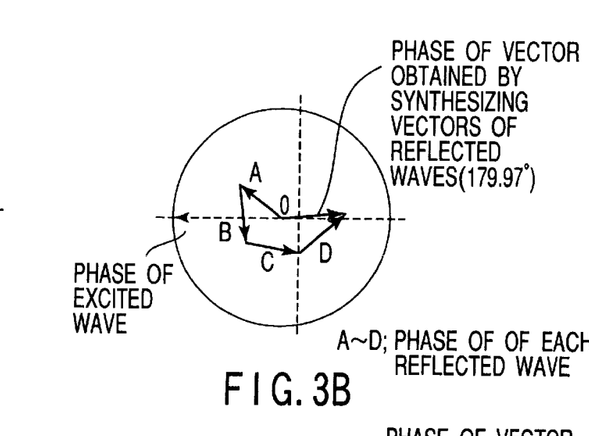
Figure 3C:
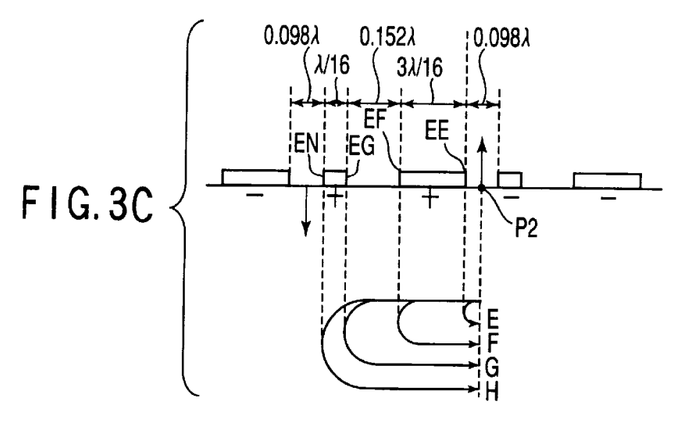
Figure 3D:
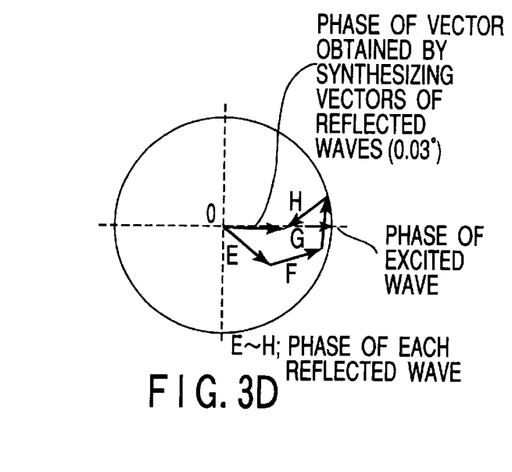

FIGS. 3A and 3C are sectional views illustrating essential parts of the surface acoustic wave apparatus of FIG. 2. FIG. 3B is a view illustrating the phase relationship between the excited wave and the internal reflected wave that advances to the left in the figure. FIG. 3D is a view illustrating the phase relationship between the excited wave and the internal reflected wave that advances to the right in the figure. In the figures, suppose that the phase of the excited wave is a reference value, and the clockwise direction with respect to the phase of the vector of the excited wave is the direction of a phase delay in the reflected wave.

Referring first to FIGS. 3A and 3B, a description will be given of the relationship between the excited wave and the reflected wave that advances to the left in the figures.

Suppose that P1 represents any randomly-selected excitation point at which the surface acoustic wave is excited, A represents a reflected wave reflected from one EA of the edges of an electrode finger of a width ($\lambda/16$) closest to the excitation point, and B represents a reflected wave reflected from the other edge EB of the electrode finger. Further, suppose that C represents a wave from the excitation point as a reference point, which is passed through the electrode finger closest to the excitation point, and reflected from one EC of the edges of an electrode finger of a width of $3\lambda/16$ adjacent to the first-mentioned electrode finger, and D represents a reflected wave reflected from the other edge ED of the second-mentioned electrode finger.

Concerning the reflected wave A, a phase delay element equal to a distance of $0.098\lambda$ with respect to the phase of the excited wave at the excitation point occurs, and hence a phase delay of 35.28° occurs with respect to the phase of the excited wave. In other words, supposing that a delay=X, X=35.28° is given by the following equation:

$$((^{0.098}/_2)\times 2)\lambda : X=\lambda : 360°$$

(×2) included in this equation indicates a coefficient for obtaining a double distance.

Further, concerning the reflected wave B, a phase delay element equal to a distance of $(0.098+(\frac{1}{8}))\lambda$ with respect to the phase of the excited wave at the excitation point P1 occurs, and phase inversion $((\frac{1}{2})\lambda)$ occurs at the edge EB. Accordingly, a phase delay of 260.28° occurs with respect to the phase of the excited wave. In other words, supposing that a delay=X, X=360×(0.098+($\frac{1}{8}$)+($\frac{1}{2}$))=260.28° is given by $$\{((0.098/2)\times 2)+((\tfrac{1}{16})\times 2)+(\tfrac{1}{2})\}\lambda : X=\lambda : 360$$

(×2) included in this equation indicates a coefficient for obtaining a double distance, and (½) indicates the amount of phase inversion at the edge EB.

Concerning the reflected wave C, a phase delay element equal to a distance of $(0.098+(\frac{1}{8})+0.304) \lambda$ with respect to the phase of the excited wave at the excitation point P1 occurs, and hence a phase delay of 189.72° occurs with respect to the phase of the excited wave. In other words, supposing that a delay=X, X=360×(0.098+($\frac{1}{8}$)+0.304)=189.72° is given by $$\{((^{0.098}/_2)\times 2)+((\tfrac{1}{16})\times 2)+(0.152\times 2)\}\lambda : X=\lambda : 360$$

(×2) included in this equation indicates a coefficient for obtaining a double distance.

Concerning the reflected wave D, a phase delay element equal to a distance of $(0.098+(\frac{1}{8})+\frac{3}{8}) \lambda$ with respect to the phase of the excited wave at the excitation point P1 occurs, and phase inversion occurs at the edge ED. Accordingly, a phase delay of 144.72° occurs with respect to the phase of the excited wave. In other words, supposing that a delay=X, X=360×((0.098+($\frac{1}{8}$)+0.304+($\frac{3}{8}$)+($\frac{1}{2}$))=504.72°=144.72° is given by $$\{((^{0.098}/_2)\times 2)+((\tfrac{1}{16})\times 2)+(0.152\times 2)+(\tfrac{3}{16})\times 2+(\tfrac{1}{2})\}\lambda : X=\lambda : 360$$

(×2) included in this equation indicates a coefficient for obtaining a double distance, and (½) indicates the amount of phase inversion at the edge ED.

The result of synthesizing the vectors of the reflected waves A, B, C and D corresponds to the phase delay amount of the internal reflected wave relative to the excited wave. As shown in FIG. 3B, the phase of the vector obtained by synthesizing the vectors of the internal reflected waves A, B, C and D is 179.97°. This value indicates that the phase is substantially an opposition to the phase of the excited wave.

The synthesized vector is obtained by synthesizing the x- and y-components of the vectors of the reflected waves A, B, C and D in the orthogonal coordinates.

Referring then to FIGS. 3C and 3D, the relationship between the reflected wave that advances to the right in the figures and the excited wave will be described.

Suppose that P2 represents any randomly-selected excitation point at which the surface acoustic wave is excited, E represents a reflected wave reflected from one EE of the edges of an electrode finger of a width ($3\lambda/16$) closest to the excitation point, and F represents a reflected wave reflected from the other edge EF of the electrode finger. Further, suppose that G represents a wave from the excitation point as a reference point, which is passed through the electrode finger closest to the excitation point, and reflected from one EG of the edges of an electrode finger of a width of $\lambda/16$ adjacent to the first-mentioned electrode finger, and H represents a reflected wave reflected from the other edge EH of the second-mentioned electrode finger.

Concerning the reflected wave E, a phase delay element equal to a distance of $0.098\lambda$ with respect to the phase of the excited wave at the excitation point P2 occurs, and hence a phase delay of 35.28° occurs with respect to the phase of the excited wave.

Further, concerning the reflected wave F, a phase delay element equal to a distance of $(0.098+(\frac{3}{8})) \lambda$ with respect to the phase of the excited wave at the excitation point P2 occurs, and phase inversion occurs at the edge EF. Accordingly, a phase delay of 350.28° occurs with respect to the phase of the excited wave.

Concerning the reflected wave G, a phase delay element equal to a distance of $(0.098+(\frac{3}{8})+0.304) \lambda$ with respect to the phase of the excited wave at the excitation point P2 occurs, and hence a phase delay of 279.72° occurs with respect to the phase of the excited wave.

Concerning the reflected wave H, a phase delay element equal to a distance of $(0.098+(\frac{3}{8})+0.304+(\frac{1}{8})) \lambda$ with respect to the phase of the excited wave at the excitation point P2 occurs, and phase inversion occurs at the edge EH. Accordingly, a phase delay of 144.72° occurs with respect to the phase of the excited wave.

The above-described phase delays can be given by the same equations as used when explaining FIGS. 3A and 3B.

The result of synthesizing the vectors of the reflected waves E, F, G and H corresponds to the phase delay amount of the internal reflected wave relative to the excited wave. As shown in FIG. 3D, the phase of the vector obtained by synthesizing the vectors of the internal reflected waves E, F, G and H is +0.03°. This value indicates that the phase is substantially equal to that of the excited wave.

In the above-described invention, pairs of electrode fingers, each pair consisting of an electrode finger of a width narrower than λ/8 and an electrode finger of a width wider than λ/8, are provided for each of the common electrodes 13 and 14. The pairs of electrode fingers provided for the common electrode 13 are included in a first group, while the pairs of electrode fingers provided for the common electrode 14 are included in a second group. The pairs of electrodes included in the first and second groups are interleaved.

As a result, when viewing the entire structure, the electrode fingers of a width narrower than λ/8 and the electrode fingers of a width wider than λ/8 are alternately arranged. More specifically, in the above-described invention, an electrode finger with a width of λ/16 and an electrode finger with a width of 3λ/16 constitute each pair. The vector characteristics shown in FIGS. 3B and 3D are obtained by selecting the interval between each pair of electrode fingers.

As understood from the vector characteristics shown in FIGS. 3B and 3D, in the above embodiment, the direction of the synthesized vector falls within the range of $n\pi\pm0.03°$ with respect to the ideal direction of propagation of the surface acoustic wave, where $\underline{n}$ is a natural number, and is an even number (including 0) when the excited wave and the reflected wave have the same phase, and an odd number when they have opposite phases.

This invention, however, is not limited to the above-mentioned values.

In the above embodiment, the position of one of each pair of electrode fingers with widths of λ/16 and 3λ/16 is selected (by, for example, shifting the electrode finger with the width of 3λ/16), thereby finally selecting the electrode intervals of 0.098λ and 0.152λ. As a result, the direction of the synthesized vector of the reflected waves falls within the range of ±0.03° with respect to the ideal direction of propagation of the surface acoustic wave.

However, a sufficient effect can be obtained even if the direction of the synthesized vector of the reflected waves falls within the range of ±5° with respect to the ideal direction of propagation of the surface acoustic wave.

In this case, it is sufficient if the electrode intervals are selected to be within each of the ranges of 0.152λ±0.007λ and 0.098λ±0.007λ (the ± and ∓ signs indicate that when the former assumes +, the latter assumes −, and vice versa) by shifting the position of one of each pair of electrode fingers with widths of λ/16 and 3λ/16.

Figure 4A:
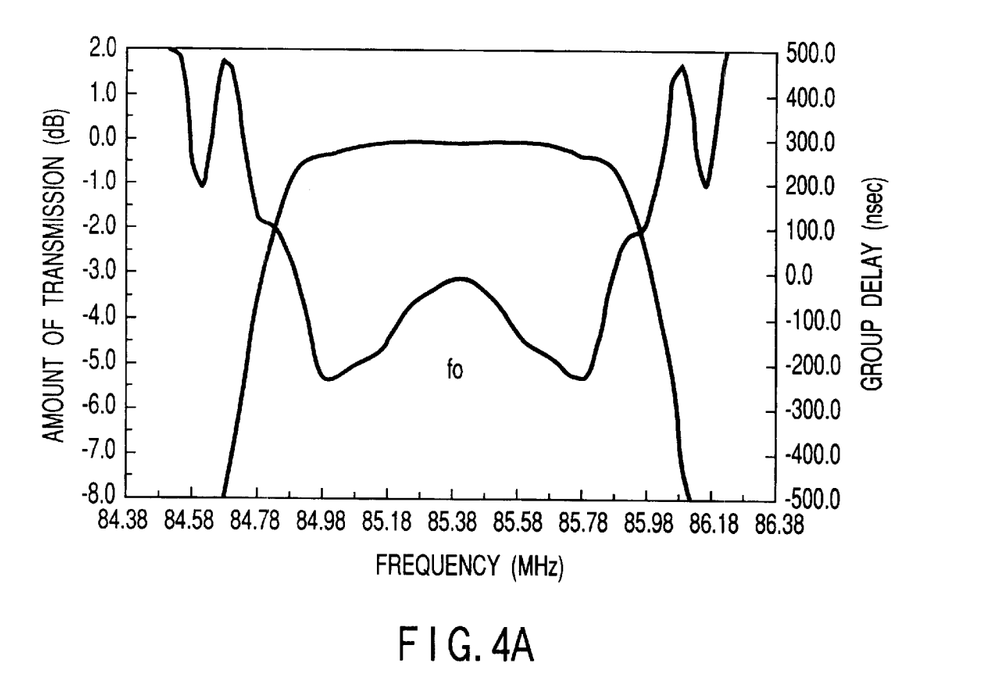
FIGS. 4A and 4B are views illustrating the frequency characteristics of the surface acoustic wave apparatus shown in FIG. 2.

FIG. 4A shows measurement results concerning the transfer characteristic and the group delay characteristic of the above-described surface acoustic wave apparatus, obtained by matching the surface acoustic wave apparatus with an external circuit. As is understood from this characteristic figure, both the transfer characteristic and the group delay characteristic are substantially symmetrical with respect to the fundamental frequency f0.

Figure 4B:
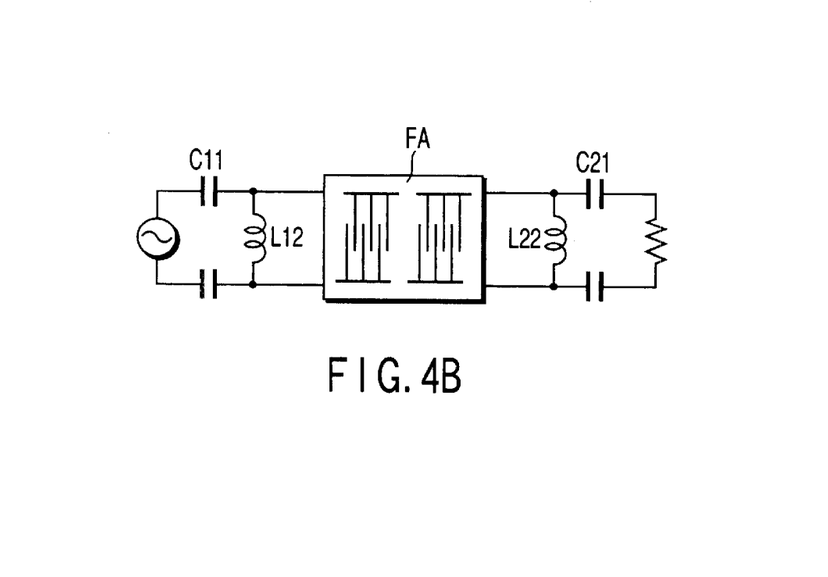

FIG. 4B shows a state in which a surface acoustic wave apparatus, to which the invention is applied, is matched with an external circuit. The entire surface acoustic wave apparatus FA actually comprises a transducer, as shown in FIG. 2, for generating a surface acoustic wave, and another transducer for receiving the propagated surface acoustic wave and converting its oscillation into an electrical signal.

The external matching circuit comprises respective elements connected to the input and output sides of the surface acoustic wave apparatus. At the input side, there are provided an inductor L12 connected to a signal input terminal and a ground connection terminal, and a capacitor C11 having one terminal thereof connected to the signal input terminal. At the output side, there are provided an inductor L22 connected to a signal output terminal and the ground connection terminal, and a capacitor C21 having one terminal thereof connected to the signal output terminal. Although this example employs a matching circuit formed of L and C, another means may be used in which matching is performed by adjusting the impedance of the surface acoustic wave apparatus.

In the above-described embodiment, the distances t1 and t2 between the centers of adjacent electrode fingers are accurately determined in order to impart an optimal transfer directional property to the fundamental wave of the surface acoustic wave. However, the present invention is not limited to this. It is a matter of course that a deviation imparted to t1 or t2 may be increased or reduced in accordance with the properties demanded by the surface acoustic wave apparatus.

In the above-described embodiment, the interval between an electrode finger with the width of λ/16 and an electrode finger located at the left side thereof in the figure is set narrower than that between an electrode finger with the width of λ/16 and an electrode finger located at the right side thereof in the figure. However, the invention is not limited to this. When using a piezoelectric substrate having a propagation characteristic different from that of the above-described piezoelectric substrate, it is possible that the positional relationship between the narrower interval and the wider interval will be opposite.

The present invention is not limited to the above-described embodiment.

Figure 5:
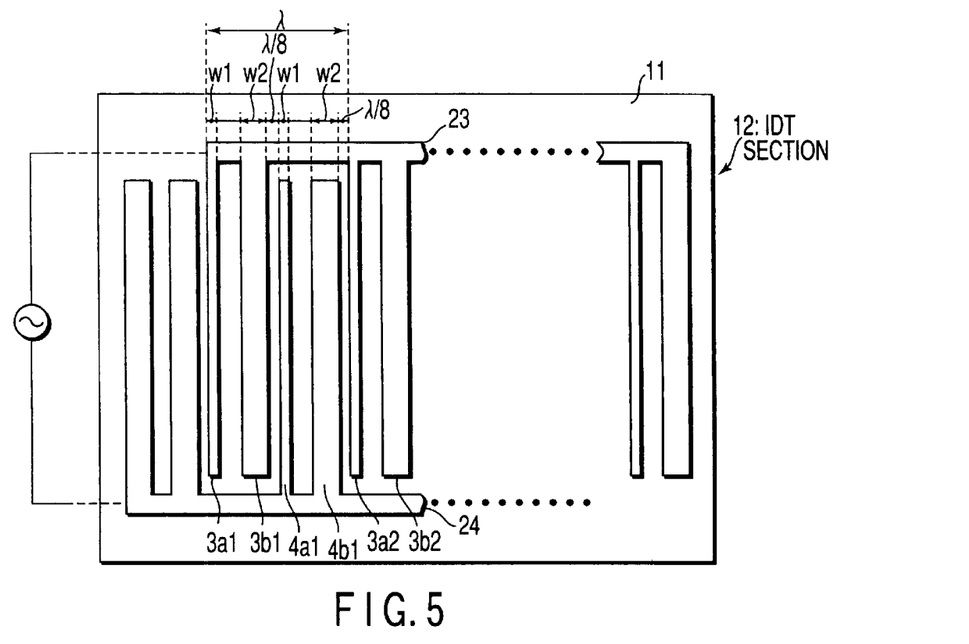
FIG. 5 is a view illustrating a surface acoustic wave apparatus according to another embodiment of the present invention.

FIG. 5 illustrates another embodiment of the present invention.

Reference numeral 11 denotes a piezoelectric substrate made of crystal, on one surface of which an interdigital transducer section 12 is formed.

In the interdigital transducer section 12, a first common electrode 23 and a second common electrode 24 are arranged parallel to each other with a space interposed therebetween. The first common electrode 23 is connected to a first split electrode group (electrode fingers 3a1, 3b1, 3a2, 3b2, 3a3, 3b3, . . . ) extending toward the second common electrode 24. Further, the second common electrode 14 is connected to a second split electrode group (electrode fingers 4a1, 4b1, 4a2, 4b2, 4a3, 4b3, . . . ) extending toward the first common electrode 13. The electrode fingers 4a2, 4b2, 4a3, 4b3, . . . are not shown.

In the first split electrode group, pairs of narrow-width electrode fingers (with suffix a) and wide-width electrode fingers (with suffix b) are arranged repeatedly with a certain interval between adjacent pairs. The cycle of the repetition is λ. Also in the second split electrode group, pairs of narrow-width electrode fingers (with suffix a) and wide-width electrode fingers (with suffix b) are arranged repeatedly with a certain interval between adjacent pairs. The cycle of the repetition is λ.

The pairs of electrode fingers (3a1, 3b1), (3a2, 5b2), (3a3, 3b3), . . . included in the first split electrode group and the pairs of electrode fingers (4a1, 4b1), (4a2, 4b2), (4a3, 4b3), . . . included in the second split electrode group are interleaved. When viewing the entire structure, the narrow-width electrode fingers and the wide-width electrode fingers are alternately arranged.

The common electrodes 13 and 14 and the split electrode groups are formed of electrode films containing aluminum (Al) or an aluminum (Al) alloy as a main component.

Further, in this embodiment, each pair of electrode fingers consist of an electrode finger $3b1, 3b2, 3b3, \ldots, 4a1, 4a2, 4a3, \ldots$, which has a width narrower than $\lambda/8$ ($\lambda$ indicates the wavelength of a surface acoustic wave serving as the operation central frequency), and an electrode finger $3a1, 3a2, 3a3, \ldots, 4b1, 4b2, 4b3, \ldots$, which has a width wider than $\lambda/8$.

More specifically, in this embodiment, the width W1 of the narrow-width electrode fingers is $\lambda/16$, while the width W2 of the wide-width electrode fingers is $0.1535\lambda$.

Supposing, in this embodiment, that the width of the electrode fingers, which have a width narrower than a reference value ($\lambda/8$), is W1, and that of the electrode fingers, which have a width wider than a reference value ($\lambda/8$), is W2, the widths W1 and W2 are set at values that substantially satisfy the following equation:

$$\cos(k\cdot 2W2)+\sin(k\cdot 2W2)=2-\cos(k\cdot 2W1)-\sin(k\cdot 2W1)$$

(k represents the number of waves; $k=2\pi/\lambda$.)

The inventors of the present invention found as a result of research that when this equation is satisfied, the fundamental wave of the surface acoustic wave can have an optimal directional property.

In the previous embodiment, the IDT is designed such that each pair of electrode fingers have respective widths of $\lambda/16$ and $3\lambda/16$.

In this embodiment, however, the sum of the widths of each pair of electrode fingers differs from $\lambda/4$, and the width of the wider electrode fingers is determined on the basis of the above equation.

Referring now to FIGS. 6A to 6D, a description will be given of the phase relationship between the internal reflected waves and the excited wave (fundamental wave) in the surface acoustic wave apparatus of this embodiment.

Figure 6A:
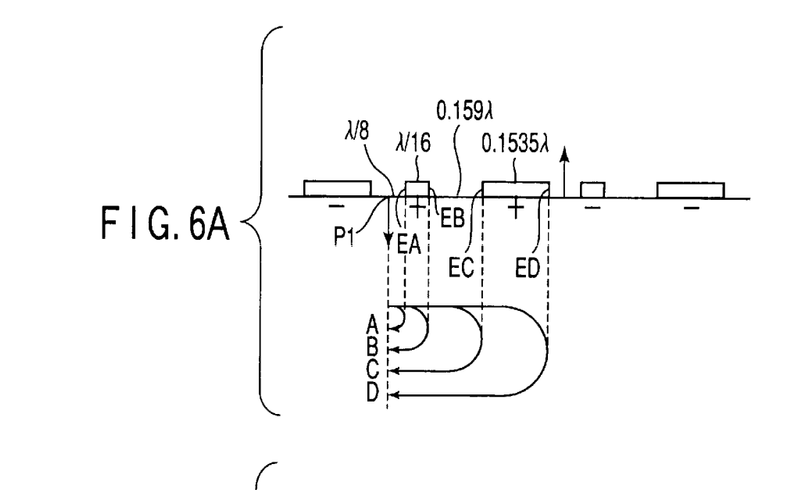
FIGS. 6A to 6D are views useful in explaining the principle of the operation of the surface acoustic wave apparatus shown in FIG. 5.
Figures 6B, 6D:
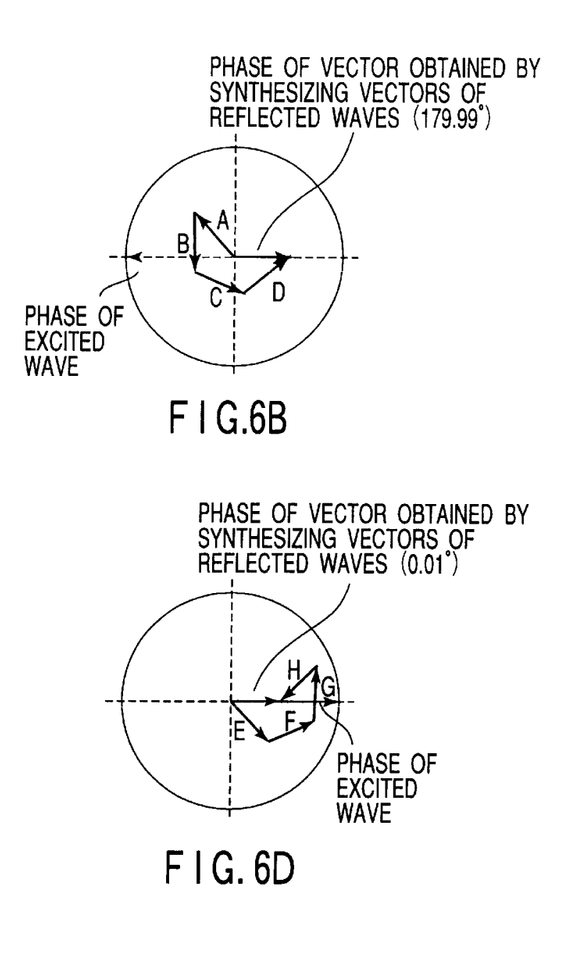
Figure 6C:
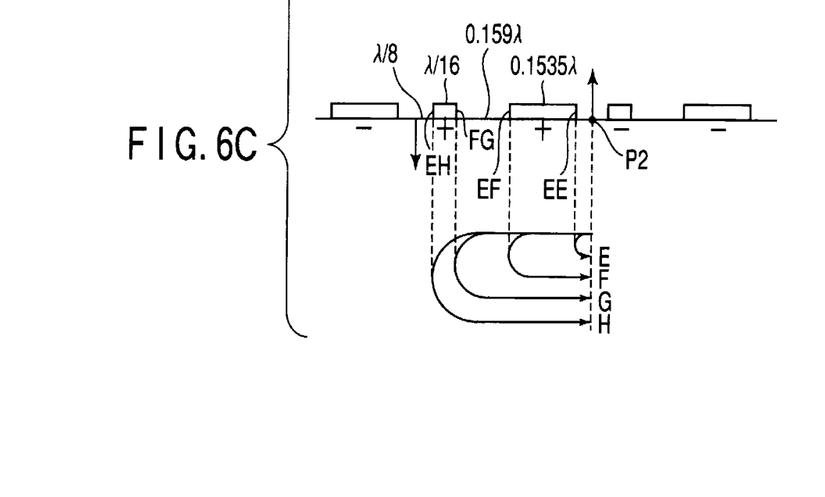

FIGS. 6A and 6C are sectional views illustrating essential parts of the surface acoustic wave apparatus of FIG. 5. FIG. 6B is a view illustrating the phase relationship between the excited wave and the internal reflected wave that advances to the left in the figure. FIG. 6D is a view illustrating the phase relationship between the excited wave and the internal reflected wave that advances to the right in the figure. In the figures, suppose that the phase of the excited wave is a reference value, and the clockwise direction with respect to the phase of the vector of the excited wave is the direction of a phase delay in the reflected wave.

Referring first to FIGS. 6A and 6B, a description will be given of the relationship between the excited wave and the reflected wave that advances to the left in the figures.

Suppose that P1 represents any randomly-selected excitation point at which the surface acoustic wave is excited, A represents a reflected wave reflected from one EA of the edges of an electrode finger of a width ($\lambda/16$) closest to the excitation point, and B represents a reflected wave reflected from the other edge EB of the electrode finger. Further, suppose that C represents a wave from the excitation point as a reference point, which is passed through the electrode finger closest to the excitation point, and reflected from one EC of the edges of an electrode finger of a width of $0.1535\lambda$ adjacent to the first-mentioned electrode finger, and D represents a reflected wave reflected from the other edge ED of the second-mentioned electrode finger.

Concerning the reflected wave A, a phase delay element equal to a distance of $(\lambda/16)\times 2$ with respect to the phase of the excited wave at the excitation point occurs, and hence a phase delay of 45° occurs with respect to the phase of the excited wave.

Further, concerning the reflected wave B, a phase delay element equal to a distance of $\{(\lambda/16)\times 2+(\lambda/16)\times 2\}$ with respect to the phase of the excited wave at the excitation point P1 occurs, and phase inversion occurs at the edge EB. Accordingly, a phase delay of 270°, i.e. (−90°), occurs with respect to the phase of the excited wave.

Concerning the reflected wave C, a phase delay element equal to a distance of $((\frac{1}{16})\times 2+(\frac{1}{16})\times 2+0.159\times 2) \lambda$ with respect to the phase of the excited wave at the excitation point P1 occurs, and hence a phase delay of 204.48° occurs with respect to the phase of the excited wave.

Concerning the reflected wave D, a phase delay element equal to a distance of $((\frac{1}{8})+(\frac{1}{8})+0.318+0.307) \lambda$ with respect to the phase of the excited wave at the excitation point P1 occurs, and phase inversion occurs at the edge ED. Accordingly, a phase delay of 135° occurs with respect to the phase of the excited wave.

The result of synthesizing the vectors of the reflected waves A, B, C and D corresponds to the phase delay amount of the internal reflected wave relative to the excited wave. As shown in FIG. 6B, the phase of the vector obtained by synthesizing the vectors of the internal reflected waves A, B, C and D is 179.99°. This value indicates that the phase is substantially an opposition to the phase of the excited wave. In other words, oscillation propagates to the right in the figure.

Referring then to FIGS. 6C and 6D, the relationship between the reflected wave that advances to the right in the figures and the excited wave will be described.

Suppose that P2 represents any randomly-selected excitation point at which the surface acoustic wave is excited, E represents a reflected wave reflected from one EE of the edges of an electrode finger of a width ($3\lambda/16$) closest to the excitation point, and F represents a reflected wave reflected from the other edge EF of the electrode finger. Further, suppose that G represents a wave from the excitation point as a reference point, which is passed through the electrode finger closest to the excitation point, and reflected from one EG of the edges of an electrode finger of a width of $\lambda/16$ adjacent to the first-mentioned electrode finger, and H represents a reflected wave reflected from the other edge EH of the second-mentioned electrode finger.

Concerning the reflected wave E, a phase delay element equal to a distance of $(\lambda/16)\times 2$ with respect to the phase of the excited wave at the excitation point P2 occurs, and hence a phase delay of 45° occurs with respect to the phase of the excited wave.

Further, concerning the reflected wave F, a phase delay element equal to a distance of $((\frac{1}{16})\times 2+ (0.1535\times 2)) \lambda$ with respect to the phase of the excited wave at the excitation point P2 occurs, and phase inversion occurs at the edge EF. Accordingly, a phase delay of 335.52° occurs with respect to the phase of the excited wave.

Concerning the reflected wave G, a phase delay element equal to a distance of $((\frac{1}{16})\times 2+0.1535\times 2+0.159\times 2) \lambda$ with respect to the phase of the excited wave at the excitation point P2 occurs, and hence a phase delay of 270° occurs with respect to the phase of the excited wave.

Concerning the reflected wave H, a phase delay element equal to a distance of $((\frac{1}{16})\times 2+0.1535\times 2+0.159\times 2+(\frac{1}{16})\times 2) \lambda$ with respect to the phase of the excited wave at the excitation point P2 occurs, and phase inversion occurs at the edge EH. Accordingly, a phase delay of 135° occurs with respect to the phase of the excited wave.

The result of synthesizing the vectors of the reflected waves E, F, G and H corresponds to the phase delay amount of the internal reflected wave relative to the excited wave. As shown in FIG. 6D, the phase of the vector obtained by synthesizing the vectors of the internal reflected waves E, F, G and H is 0.001°. This value indicates that the phase is substantially equal to that of the excited wave.

As is understood from the vector characteristics shown in FIGS. 6B and 6D, the direction of the synthesized vector falls within the range of ±0.001° with respect to the ideal propagation direction of the surface acoustic wave (the right direction in the figures).

This invention, however, is not limited to the above-mentioned values.

In the above embodiment, the position of that one of each pair of electrode fingers, which has a width of $\lambda/16$, is fixed, the other electrode finger is set to have a width of $0.1535\lambda$, and the interval between these electrode fingers is set at $0.159\lambda$. As a result, the direction of the synthesized vector of the reflected waves falls within the range of ±0.001° with respect to the ideal direction of propagation of the surface acoustic wave.

However, a sufficient effect can be obtained even if the direction of the synthesized vector of the reflected waves falls within the range of ±5° with respect to the ideal direction of propagation of the surface acoustic wave.

In this case, it is sufficient if the electrode finger with the width of $\lambda/16$ is fixed, and the width of the wider-width electrode finger is set at a value falling within the range of $0.1535\lambda \pm 0.007\lambda$. The position of each edge of electrode fingers located outside the pair of electrode fingers is fixed.

Figure 7:
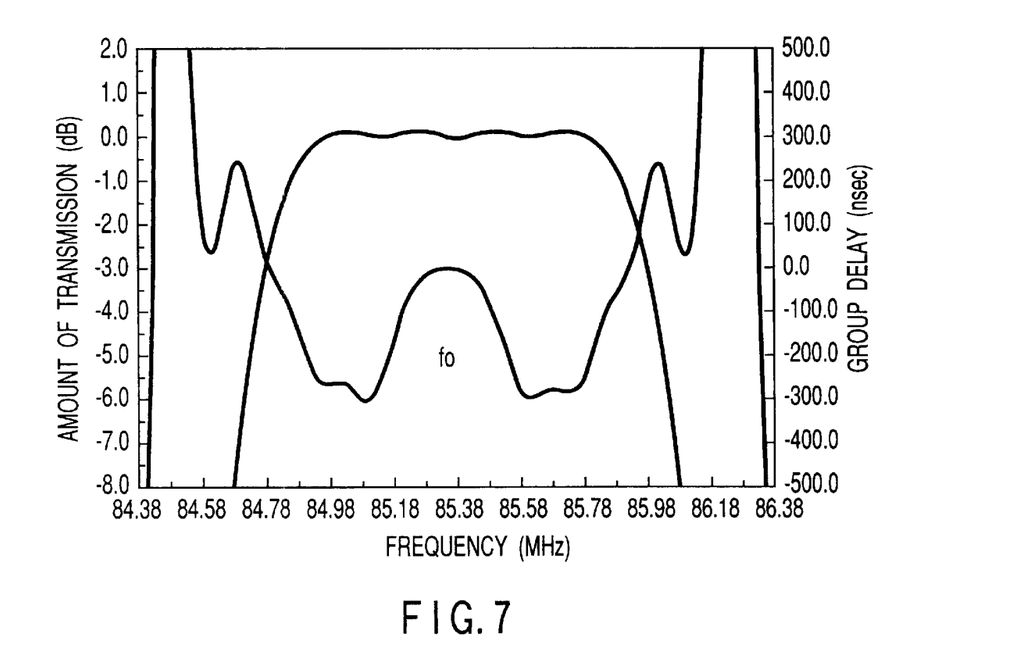
FIG. 7 is a graph illustrating the frequency characteristics of the surface acoustic wave apparatus shown in FIG. 5.

FIG. 7 shows measurement results concerning the transfer characteristic and the group delay characteristic of the above-described surface acoustic wave apparatus, obtained by matching the surface acoustic wave apparatus with an external circuit as in the previous embodiment. As is understood from this characteristic figure, both the transfer characteristic and the group delay characteristic are substantially symmetrical with respect to the fundamental frequency f0.

Although, in each of the above embodiments, the wide-width electrode fingers and the narrow-width electrode fingers are alternately arranged, the arrangement may be changed in a part of the transducer (for example, wide-width electrode fingers may be adjacent to each other). This structure enables the excited wave and the reflected wave to be weighted in accordance with the required characteristics.

The above-described surface acoustic wave apparatus of the invention shows a much better transmission function characteristic in its signal passing band, and a low insertion loss.

The surface acoustic wave apparatus of the present invention is mainly used as an intermediate frequency filter for use in electronic devices. The electronic devices include a television set, a communication device, and a cellular phone (of, for example, the CDMA system), etc. The surface acoustic wave apparatus of the invention is characterized in that it is compact and lightweight, and this feature can be utilized to the full if it is installed in a cellular phone.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A surface acoustic wave apparatus equipped with an interdigital transducer that includes first and second common electrodes formed parallel on a piezoelectric substrate, a first split electrode group connected to the first common electrode and extending toward the second common electrode, and a second split electrode group connected to the second common electrode and extending toward the first common electrode; wherein:

a plurality of pairs of electrode fingers that constitute the first split electrode group, and a plurality of pairs of electrode fingers that constitute the second split electrode group are interleaved at a cycle of $\lambda/2$;

each pair of electrode fingers includes a narrow-width electrode finger narrower than $\lambda/8$ ($\lambda$ indicates a wavelength of a surface acoustic wave serving as an operation central frequency), and a wide-width electrode finger wider than $\lambda/8$;

a synthesized vector, obtained by synthesizing vectors of waves reflected from electrode fingers that are included within a distance of $\lambda/2$ from any randomly-selected excitation point in a surface wave propagation direction, has a phase $\Phi$ expressed by $n\pi-5°\leq\Phi\leq n\pi+5°$ (n: a natural number) with respect to a phase of a wave excited by the interdigital transducer; and wherein a distance (t1) between centers of a randomly-selected electrode finger and one of the electrode fingers located at the opposite sides of the randomly-selected electrode finger, differs from a distance (t2) between centers of the randomly-selected electrode finger and the other of the electrode fingers located at the opposite sides of the randomly-selected electrode finger.

2. A surface acoustic wave apparatus equipped with an interdigital transducer that includes first and second common electrodes formed parallel on a piezoelectric substrate, a first split electrode group connected to the first common electrode and extending toward the second common electrode, and a second split electrode group connected to the second common electrode and extending toward the first common electrode; wherein:

a plurality of pairs of electrode fingers that constitute the first split electrode group, and a plurality of pairs of electrode fingers that constitute the second split electrode group are interleaved at a cycle of $\lambda/2$;

each pair of electrode fingers include a narrow-width electrode finger narrower than $\lambda/8$ ($\lambda$ indicates a wavelength of a surface acoustic wave serving as an operation central frequency), and a wide-width electrode finger wider than $\lambda/8$;

a synthesized vector, obtained by synthesizing vectors of waves reflected from electrode fingers that are included within a distance of $\lambda/2$ from any randomly-selected excitation point in a surface wave propagation direction, has a phase $\Phi$ expressed by $n\pi-5°\leq\Phi\leq n\pi+5°$ (n: a natural number) with respect to a phase of a wave excited by the interdigital transducer; and wherein said each pair of electrode fingers include a narrow-width electrode finger having a width of $\lambda/16$, and a wide-width electrode finger having a width w of $0.1465\lambda \leq w \leq 0.1605\lambda$.

3. The surface acoustic wave apparatus according to claim 1, wherein the narrow-width electrode fingers and the wide-width electrode fingers are arranged alternately, the different distances t1 and t2 appear alternately, t1 is a positive deviation from a reference value ($\lambda/4$), and t2 is a negative deviation from the reference value ($\lambda/4$).

4. The surface acoustic wave apparatus according to claim 1, wherein a sum of widths of said each pair of electrode fingers is $\lambda/4$.

5. The surface acoustic wave apparatus according to claim 4, wherein one of said each pair of electrode fingers has a width of $\lambda/16$, and the other of said each pair of electrode fingers has a width of $3\lambda/16$.

6. The surface acoustic wave apparatus according to claim 4, wherein supposing that the width of one of said each pair of electrode fingers is $\underline{w}$, the width of the other of said each pair of electrode fingers is $(\lambda/4)-\underline{w}$, and a distance between centers of these electrode fingers is x1, x1 is set at a value that substantially satisfies the following equation:

$$\tan\{k(x1-(\lambda/8))\}=1/(\cos\{k((3\lambda/4)+2w)\}$$

(k represents the number of waves; $k=2\pi/\lambda$).

7. The surface acoustic wave apparatus according to claim 4, wherein the width of one of said each pair of electrode fingers is $\lambda/16$, the width of the other of said each pair of electrode fingers is $3\lambda/16$, and a distance x2 between centers of these electrode fingers is set at a value that substantially satisfies the following equation:

$$\tan\{k(x2-\lambda/8)\}=\sqrt{2}.$$

8. A surface acoustic wave apparatus equipped with an interdigital transducer that includes first and second common electrodes formed parallel on a piezoelectric substrate, a first split electrode group connected to the first common electrode and extending toward the second common electrode, and a second split electrode group connected to the second common electrode and extending toward the first common electrode; wherein:

a plurality of pairs of electrode fingers that constitute the first split electrode group, and a plurality of pairs of electrode fingers that constitute the second split electrode group are interleaved;

each pair of electrode fingers include a narrow-width electrode finger narrower than $\lambda/8$ ($\lambda$ indicates a wavelength of a surface acoustic wave serving as an operation central frequency), and a wide-width electrode finger wider than $\lambda/8$;

a sum of the widths of the narrow-width electrode finger and the wide-width electrode finger is lower than $\lambda/4$;

a sum of the widths of the narrow-width electrode finger and the wide-width electrode finger and a distance between adjacent edges of these electrode fingers is $3\lambda/8$; and the narrow-width electrode finger has a width of $\lambda/16$.

9. The surface acoustic wave apparatus according to claim 8, wherein supposing that one of said each pair of electrode fingers is w1, and the width of the other of said each pair of electrode fingers is w2, w1 and w2 are set at values that substantially satisfy the following equation:

$$\cos(k\cdot 2w2)+\sin(k\cdot 2w2)=2-\cos(k\cdot 2w1)-\sin(k\cdot 2w1)$$

(k represents the number of waves; $k=\pi/\lambda$).

10. The surface acoustic wave apparatus according to claim 7, wherein one of said each pair of electrode fingers has a width of $\lambda/16$, and the other of said each pair of electrode fingers has a width of $0.1535\lambda$.

* * * * *